(12) United States Patent
Kwon

(10) Patent No.: US 7,654,786 B2
(45) Date of Patent: Feb. 2, 2010

(54) SUBSTRATE CARRYING METHOD THEREOF

(75) Inventor: O Jun Kwon, Gyeongsan-si (KR)

(73) Assignee: LG. Display Co., Ltd., Seoul (KR)

( * ) Notice: Subject to any disclaimer, the term of this patent is extended or adjusted under 35 U.S.C. 154(b) by 556 days.

(21) Appl. No.: 11/171,852

(22) Filed: May 29, 2005

(65) Prior Publication Data

US 2006/0018749 A1    Jan. 26, 2006

(30) Foreign Application Priority Data

Jun. 30, 2004    (KR) .................. 10-2004-0049968

(51) Int. Cl.
*B65H 1/00*    (2006.01)
(52) U.S. Cl. .................. 414/226.02; 414/627; 414/806
(58) Field of Classification Search .................. 414/741, 414/737
See application file for complete search history.

(56) References Cited

U.S. PATENT DOCUMENTS

| | | | | |
|---|---|---|---|---|
| 2,628,453 A | * | 2/1953 | Telford et. al. .............. | 225/103 |
| 2,783,078 A | * | 2/1957 | Billner ..................... | 294/65 |
| 5,024,575 A | * | 6/1991 | Anderson ................... | 414/627 |
| 5,752,729 A | * | 5/1998 | Crozier et al. ............... | 294/2 |
| 6,379,221 B1 | * | 4/2002 | Kennedy et al. ............. | 451/41 |
| 6,584,925 B2 | * | 7/2003 | Kapsner et al. ............. | 114/361 |
| 6,652,014 B2 | * | 11/2003 | Schmalz et al. ............. | 294/65 |
| 6,988,879 B2 | * | 1/2006 | Ho et al. ................... | 425/126.1 |
| 7,044,706 B2 | * | 5/2006 | Jung ........................ | 414/737 |

* cited by examiner

*Primary Examiner*—Saúl J Rodríguez
*Assistant Examiner*—Joshua I Rudawitz
(74) *Attorney, Agent, or Firm*—Brinks Hofer Gilson & Lione

(57) ABSTRACT

A shuttle is disclosed in which a large-sized substrate is prevented from sagging under its weight or from slipping. The shuttle includes a body, support pins supporting sides of the substrate, and shuttle arms provided to sides of the body to rotate in an axial direction and move in a right-to-left direction. The support pins are coupled with the shuttle arms, respectively. A pair of center supports support center parts of sides of the substrate not supported by the support pins. The center supports are movably coupled to a main frame in a front-to-rear direction. A driving unit moves and rotates the shuttle arms in the right-to-left direction. The driving unit moves the center supports in the front-to-rear direction using the main frame. A vacuum instrument assembly is provided to each of the support pins to securely hold the substrate by a vacuum force.

5 Claims, 3 Drawing Sheets

SUBSTRATE CARRYING METHOD THEREOF

This application claims the benefit of the Korean Patent Application No. P2004-49968, filed on Jun. 30, 2004, which is hereby incorporated by reference as if fully set forth herein.

FIELD OF THE INVENTION

The present invention relates to an apparatus for fabricating a liquid crystal display (LCD), and more particularly, to a shuttle and substrate carrying method thereof Although the present invention is suitable for a wide scope of applications, it is particularly suitable for carrying a wide substrate to prevent the wide substrate from being bent or transformed.

DISCUSSION OF THE RELATED ART

With the development of the information-oriented society, the demand for advanced display devices has increased. Much research and development has gone into various flat panel display devices such as LCD (liquid crystal display), PDP (plasma display panel), ELD (electroluminescent display), VFD (vacuum fluorescent display) and the like. Some of these flat panel displays have been already used as displays in various instruments.

Among the flat panel displays, the LCD has been widely used for a mobile image display to replace CRT (cathode ray tube). The LCD is lightweight, slim and has low power consumption. Moreover, the LCD is being developed to be applicable to various fields for a TV monitor, a computer monitor and the like to receive and display broadcast signals.

Despite various technological developments for the LCD to play a role as an image display device, the above-explained advantages of the LCD become obstacles in enhancing the image quality as the image display device.

A liquid crystal display device consists of a first substrate, a second substrate bonded to the first substrate to leave a predetermined gap in-between, and a liquid crystal layer injected between the first and second glass substrates.

The first substrate consists of a plurality of gate lines arranged in one direction to be evenly spaced apart from each other, a plurality of data lines arranged in a direction perpendicular to the gate lines to be evenly spaced apart from each other, a plurality of pixel electrodes arranged in a matrix form on a plurality of pixel areas defined by a plurality of intersections between the gate and data lines, respectively, and a plurality of thin film transistors provided to the pixel areas to deliver signals of the data lines to the pixel electrodes by being switched by signals of the gate lines, respectively.

The second substrate consists of a black matrix layer to cut off light from an area excluding the pixel areas, an R/G/B color filter layer to represent colors, and a common electrode to implement an image.

Recently, the size of the liquid crystal display device has increased and has become large-sized to meet the demand for large screen displays. Large-sized glass substrates are used in fabricating a large-sized liquid crystal display device. In fabricating the large-sized liquid crystal display device with the large-sized glass substrates, various processes including an array process, a cell process and the like are carried out.

In the array process, a plurality of LCD panel areas are defined on a first large-sized glass substrate and a TFT array including gate lines, data lines, pixel electrodes and thin film transistors is then formed on each of the LCD panels. A color filter array including a black matrix, a color filter layer, a common electrode and the like is formed on each panel area of a second large-sized glass substrate.

In the cell process, an alignment substance is coated on each of the TFT array substrate and the color filter array substrate and an alignment process (rubbing) is then carried out on each of the alignment substance to give uniform directionality to liquid crystals. To maintain a uniform cell gap, spacers are scattered and a sealant is then formed to bond the two substrates together. After the two substrates have been bonded together, a liquid crystal layer is formed between the bonded substrates. The bonded substrates having the liquid crystal layer in-between are cut into unit LCD panels.

A liquid crystal injecting method and a liquid crystal dropping method are used to form the liquid crystal layer between the two substrates. In the liquid crystal injecting method, liquid crystals are injected between the bonded two substrates of the unit LCD panel formed by cutting the bonded first and second mother glass substrate into the unit LCD panels. In contrast, in the liquid crystal dropping method liquid crystals are dropped appropriately on each LCD panel area of the first or second mother glass substrate, the first and second mother substrate are bonded together, and the bonded substrates are cut into unit LCD panels.

Thus, the array process uses deposition, exposure and etch instruments to form various patterns on the glass substrates. The large-sized glass substrates are transported from one instrument to another. So, a shuttle is provided to each of the instruments to transport the large-sized glass substrates.

The shuttle is explained in detail as follows.

FIG. 1 is a layout of a spinless coater for fabrication a liquid crystal display device according to a related art. Referring to FIG. 1, a spinless coater consists of a loader unit (LDR), a coater unit (SPL), a vacuum dry unit (VCD), and an unloader unit (ULD). Shuttles 1 are provided between the units to transport the substrates between the units.

The shuttle 1, as shown in FIG. 1, is provided to each process instrument and supports one side of a large-sized glass substrate to be transported. The shuttle 1 consists of shuttle arms, a driving unit, center supports, a main frame that receives power from the driving unit, and support pins.

The shuttle arms are provided to both lateral sides of the driving unit. The shuttle arm receives power from the driving unit move right/left and rotate. A plurality of the support pins in the shuttle arm permit the shuttle arm to rotate. Normally, seven support pins are provided in one shuttle arm to support opposing sides of a large-sized glass substrate. The main frame supports other sides of the large-sized glass substrate and is moved in right-to-left direction.

The above-configured shuttle 1 is moved over the large-sized glass substrate loaded on the corresponding process instrument and then positioned to a height to receive the large-sized glass substrate. The driving unit rotates the shuttle arm and a plurality of the support pins assembled to the shuttle arm so that a plurality of the support pins can support the sides of the large-sized glass substrate. A plurality of the support pins is rotated to support two of the sides of the large-sized glass substrate. Moreover, the driving unit transfers power to the main frame so that the center supports can support the other two sides of the large-sized glass substrate.

The shuttle receives the large-sized glass substrate in the above manner and then transports the large-sized glass substrate to another process instrument. However, when the related art shuttle receives the large-sized glass substrate, the large-sized glass substrate sags under its weight or slips over the shuttle.

SUMMARY OF THE INVENTION

By way of introduction only, in one aspect the shuttle includes a body, a plurality of first and second support pins adapted to support opposing sides of a substrate, first and second shuttle arms provided to opposing sides of the body to rotate in an axial direction and to move in a right-to-left direction the first and second support pins are coupled with the first and second shuttle arms, respectively, a pair of center supports adapted to support center parts of sides of the substrate not supported by the first and second support pins, a main frame to which the center supports are movably coupled in a front-to-rear direction, a driving unit moving and rotating the first and second shuttle arms in the right-to-left direction, the driving unit moving the center supports in the front-to-rear direction using the main frame, and a vacuum instrument assembly provided to each of the first and second support pins to hold the substrate by a vacuum force.

Preferably, the vacuum instrument assembly includes a plurality of vacuum pads provided to the first and second support pins to hold the substrate by vacuum suction, and a vacuum line delivering the vacuum force to each vacuum pad.

Preferably, each of the support pins includes a coupling portion coupled with the first or second shuttle arm, an extension portion extending from the coupling portion, and a support portion vertically bent from the extension portion to support the substrate.

In another aspect the shuttle includes a body and supports on sides of the body that are adapted to support a plurality of sides of a substrate. At least one set of the adjustable supports are rotatable. At least some of the supports are coupled to a support bar. The support bar is movable to adjust a width of the body. A driving unit is adapted to move the support bar. The supports apply a vacuum force to the substrate using a vacuum instrument assembly.

In another aspect, a method of transporting a substrate includes: providing the substrate to a shuttle having a vacuum pad, fixing the substrate to the shuttle by providing a vacuum force to the vacuum pad, transporting the substrate carried by the shuttle to a process instrument, terminating the vacuum force and separating the substrate from the shuttle after the vacuum force has been terminated.

Preferably, providing the substrate includes spacing center supports apart from each other greater than a length of the substrate, spacing shuttle arms apart from each other from each other longer than a width of the substrate, and upwardly rotating support pins, placing the shuttle over the substrate, and narrowing a space between the shuttle arms and narrowing a gap between the center supports such that edges of the substrate are supported by the support portions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
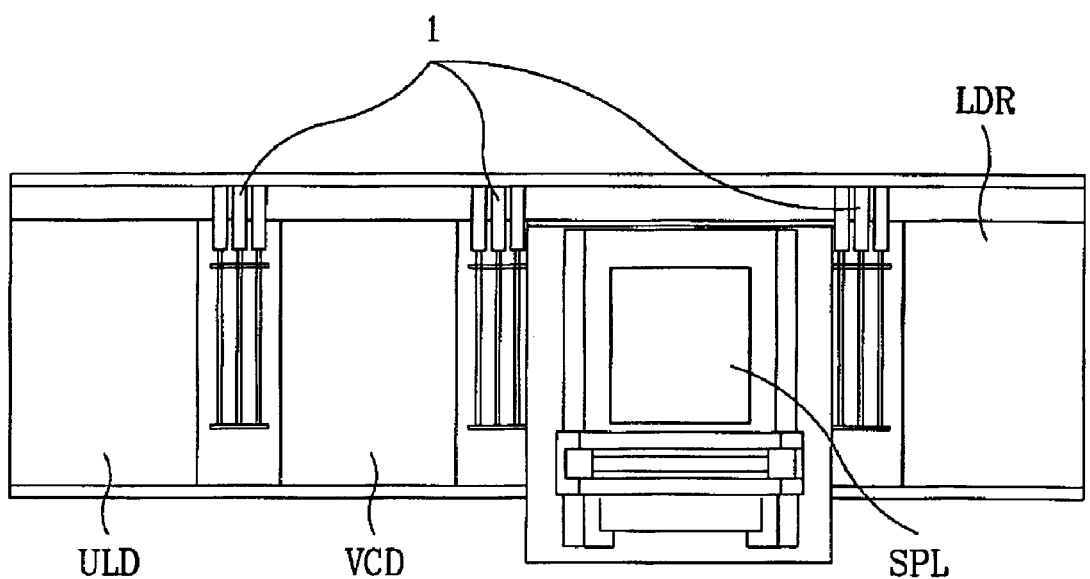
FIG. 1 is a layout of a spinless coater for fabrication a liquid crystal display device according to a related art.
Figure 2:
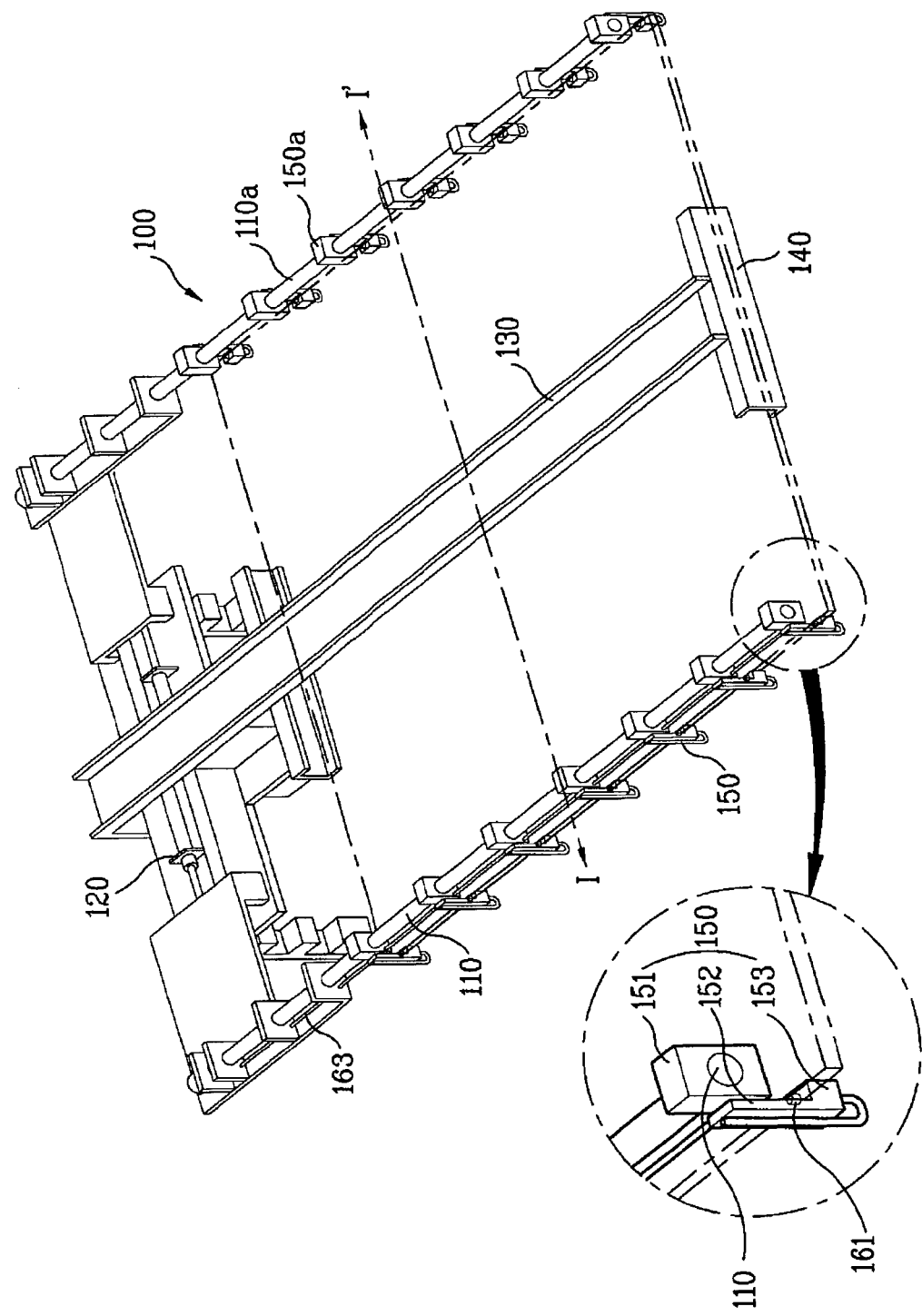
FIG. 2 is a perspective diagram of a shuttle for carrying a large-sized substrate according to the present invention.
Figure 3:
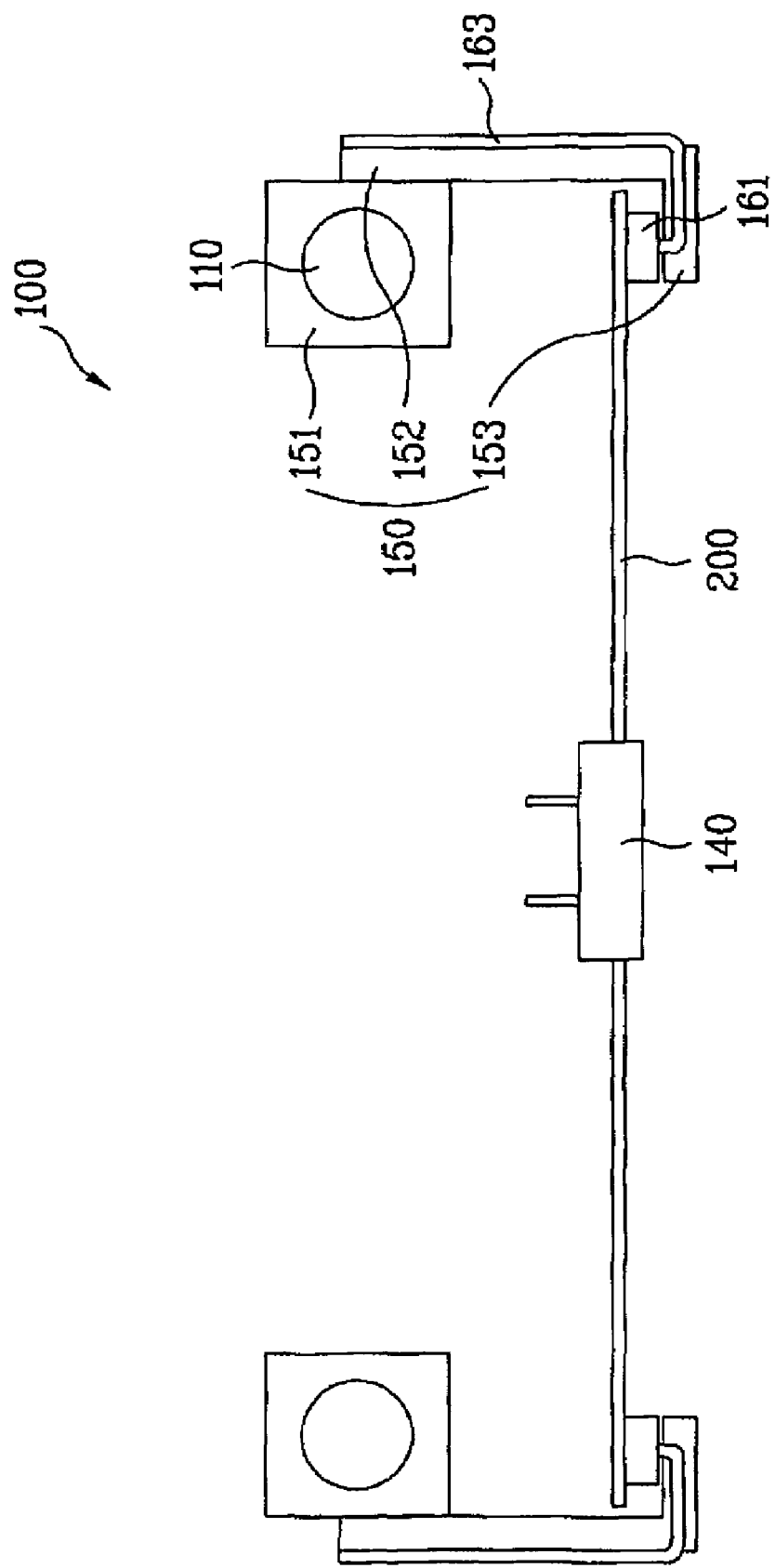
FIG. 3 is a cross-sectional diagram of the shuttle taken along a cutting line I-I' in FIG. 2.

FIG. 2 is a perspective diagram of a shuttle for carrying a large-sized substrate according to the present invention and FIG. 3 is a cross-sectional diagram of the shuttle taken along a cutting line I-I' in FIG. 2.

Referring to FIG. 2 and FIG. 3, the shuttle 100 includes first and second shuttle arms 110 and 110a, a plurality of first and second support pins 150 and 150a, center supports 140, a driving unit 120, and a vacuum instrument assembly 161 and 163.

The plurality of first and second support pins 150 and 150a are provided to two sides of a body of the shuttle 100 to support two sides of a large-sized substrate. The first and second support pins 150 and 150a are provided to the first and second shuttle arms 110 and 110a, respectively.

The first and second shuttle arms 110 and 110a are provided to respective sides of the body of the shuttle 100. Each of the first and second shuttle arms 110 and 110a is rotatable in an axial direction and is movable in right-to-left direction.

The center supports 140 support center parts of the other sides of the large-sized substrate that are not supported by the plurality of the first and second support pins 150 and 150a The center supports 140 are movably coupled a main frame 130 in a front-to-rear direction.

The driving unit 120 rotates the first and second shuttle arms 110 and 110a or moves the first and second shuttle arms 110 and 110a in the right-to-left direction. The driving unit 120 moves the center supports in the front-to-rear direction using the main frame 130.

The vacuum instrument assembly 161 and 163 is provided to the first and second support pins 150 and 150a to securely hold the large-sized substrate with a vacuum force.

Each of the first or second support pins 150 or 150a includes a coupling portion 151 coupling the first or second shuttle arm 110 or 110a thereto by being penetrated by the first or second shuttle arm 110 or 110a, an extension portion 152 extending from the coupling portion 151, and a support portion 153 vertically bent from the extension portion 152 to support the large-sized substrate.

The vacuum instrument assembly 161 and 163 includes a vacuum pad 161, a vacuum device (not shown in the drawing), and a vacuum line 163.

The vacuum pad 161 is provided to an upper surface of the support portion 153 of the first or second support pin 150 or 150a and securely holds each edge of the sides of the large-sized substrate by vacuum suction. The vacuum device can be provided to an inside or outside of the shuttle 100 and generates the vacuum force for the vacuum pad 161 to hold the substrate. The vacuum line 163 diverges to a lateral side of the shuttle arm 110 or 110a and a lateral side of the extension portion 152 of each of the support pins 150 or 150a to deliver the vacuum force generated from the vacuum device to the corresponding vacuum pad 161.

The first and second shuttle arms 110 and 110a coupled with the plurality of the first and second support pins 150 and 150a perform axial rotations so that a plurality of the first and second support pins 150 and 150a can support lower parts of the sides of the large-sized substrate, respectively. The first and second shuttle arms 110 and 110a are provided in the vicinity of both lateral sides of the large-sized substrate, respectively. A plurality of the first and second support pins 150 and 150a appropriately cope with various sizes of large-sized substrates. Hence, the first and second shuttle arms 110 and 110a are configured to move in the right-to-left direction to adjust positions of a plurality of the first and second support pins 150 and 150a, respectively. Namely, in order to support the large-sized substrate, the first and second shuttle arms 110 and 110a are rotatable and are movable in the right-to-left direction. The driving unit 120 rotates or moves the first and second shuttle arms 110 and 110a in the right-to-left direction.

The other sides of the large-sized substrate are supported by the center supports 140. The center supports 140 are movable in the right-to-left direction beneath the main frame 130 to support the large-sized substrate. The main frame 130 is coupled with the driving unit 120 to make the center supports 140 movable in the front-to-rear direction.

An operation of the above-configured shuttle 100 according to the present invention is explained with reference to FIG. 3 as follows.

First of all, the large-sized substrate is loaded in a corresponding process instrument before a particular process takes place or after completion of the process. The shuttle 100 is then moved over the large-sized substrate to receive the large-sized substrate loaded in the process instrument.

In order for the center supports 140 and the plurality of the support pins 150 and 150a not to interfere with the large-sized substrate, the center supports 140 are separated from each other greater than a length of the large-sized substrate, a plurality of the first and second support pins 150 and 150a are spaced from each other longer than a width of the large-sized substrate, and each of the support pins 150 and 150a is upwardly rotated.

Hence, in order to leave a space greater than the width of the large-sized substrate between a plurality of the first and second support pins 150 and 150a, the driving unit 120 moves the first and second shuttle arms 110 and 110a coupled with a plurality of the first and second support pins 150 and 150a in the right-to-left direction. The driving unit 120 also rotates the first and second arms 110 and 110a to sustain the upwardly rotated states of the support pins 150 and 150a. The driving unit 120 drives the center supports 140 to be spaced from each other greater than the length of the large-sized substrate.

With the above states, the shuttle 100 is positioned over the large-sized substrate.

Subsequently, to support the large-sized substrate, the driving unit 130 rotates the first and second shuttle arms 110 and 110a coupled with a plurality of the first and second support pins 150 and 150a, respectively so that the support portions 153 of a plurality of the first and second support pins 150 and 150a are placed under the large-sized substrate. The driving unit then drives the first and second shuttle arms 110 and 110a to almost approach the edges of the substrate to narrow the space between the first and second shuttle arms 110 and 110a.

Thereafter, the driving unit 130 moves the center supports 140 in the front-to-rear direction to narrow the gap between the center supports 140 so that the center supports 140 can support the other both sides of the large-sized substrate, respectively.

Once a plurality of the first and second support pins 150 and 150a and the center supports 140 are placed to support the large-sized substrate, the vacuum instrument assembly 161 and 163 provides the vacuum force to the vacuum pads 161 to securely hold the large-sized substrate by vacuum suction. Hence, the vacuum pads 161 fix the large-sized substrate thereto, whereby the large-sized substrate can be prevented from sagging or moving with the shuttle 100.

While the above state is sustained, the shuttle 100 takes the large-sized substrate and then transports it to the next process instrument. Thereafter, the vacuum instrument assembly releases the vacuum force to separate the large-sized substrate from the shuttle 100 for the progress of the next process.

Accordingly, the present invention provides the following effect or advantage. First of all, the shuttle transports the large-sized substrate securely holding sides of the large-sized substrate using the vacuum pads to prevent the large-sized substrate from sagging or moving within the shuttle. Therefore, in transporting the large-sized substrate, substrate breakage and fabrication failure of the liquid crystal display device is minimized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shuttle comprising:
    a body;
    a plurality of first and second support pins adapted to support opposing sides of a substrate;
    first and second shuttle arms provided to opposing sides of the body to rotate in an axial direction and to move in a right-to-left direction, the first and second support pins mounted on the first and second shuttle arms, respectively;
    a pair of center supports adapted to support center parts of sides of the substrate not supported by the first and second support pins;
    a main frame to which the center supports are movably coupled in a front-to-rear direction;
    a driving unit for rotating and additionally linearly moving and rotating the first and second shuttle arms in the right-to-left direction relative to the center supports, the driving unit moving the center supports in the front-to-rear direction using the main frame; and
    a vacuum instrument assembly provided to each of the first and second support pins adapted to hold the substrate by a vacuum force.

2. The shuttle of claim 1, the vacuum instrument assembly comprising:
    a plurality of vacuum pads provided to the first and second support pins to hold the substrate by vacuum suction; and
    a vacuum line delivering the vacuum force to each of the vacuum pads.

3. The shuttle of claim 1, each of the support pins comprising:
    a coupling portion coupled with the first or second shuttle arm;
    an extension portion extending from the coupling portion; and
    a support portion vertically bent from the extension portion adapted to support the substrate.

4. The shuttle of claim 3, the vacuum instrument assembly comprising:
- a vacuum pad provided to an upper surface of the support portion adapted to fix the substrate thereto; and
- a vacuum line provided to the shuttle arm and the extension portion of the support pin to deliver the vacuum force to the vacuum pad.

5. A method of transporting a substrate, the method comprising:
- providing the substrate to a shuttle having a vacuum pad;
- fixing the substrate to the shuttle by providing a vacuum force to the vacuum pad;
- transporting the substrate carried by the shuttle to a process instrument;
- terminating the vacuum force; and
- separating the substrate from the shuttle after the vacuum force has been terminated,
- wherein the step of providing the substrate includes,
- spacing center supports apart from each other greater than a length of the substrate, spacing shuttle arms apart from each other from each other longer than a width of the substrate, and upwardly rotating support pins;
- placing the shuttle over the substrate;
- placing support portions of the support pins under the substrate by rotating the shuttle arms to support the substrate; and
- narrowing a space between the shuttle arms and a gap between the center supports such that edges of the substrate are supported by the support portions.

* * * * *

UNITED STATES PATENT AND TRADEMARK OFFICE
CERTIFICATE OF CORRECTION

PATENT NO.      : 7,654,786 B2                                    Page 1 of 1
APPLICATION NO. : 11/171852
DATED           : February 2, 2010
INVENTOR(S)     : O Jun Kwon It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1138 days.

Signed and Sealed this

Twenty-third Day of November, 2010

David J. Kappos
*Director of the United States Patent and Trademark Office*